United States Patent
Chi et al.

(10) Patent No.: US 12,080,340 B2
(45) Date of Patent: Sep. 3, 2024

(54) CONTROL CIRCUIT, METHOD FOR READING AND WRITING AND MEMORY

(71) Applicant: CHANGXIN MEMORY TECHNOLOGIES, INC., Hefei (CN)

(72) Inventors: Sungsoo Chi, Hefei (CN); Shuyan Jin, Hefei (CN); Fengqin Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 232 days.

(21) Appl. No.: 17/737,109

(22) Filed: May 5, 2022

(65) Prior Publication Data

US 2023/0005523 A1    Jan. 5, 2023

(30) Foreign Application Priority Data

Jul. 2, 2021    (CN) .......................... 202110750195.1

(51) Int. Cl.
*G11C 11/4096*    (2006.01)
*G11C 11/4091*    (2006.01)
*G11C 11/4094*    (2006.01)

(52) U.S. Cl.
CPC ...... *G11C 11/4096* (2013.01); *G11C 11/4091* (2013.01); *G11C 11/4094* (2013.01)

(58) Field of Classification Search
CPC ............ G11C 11/4096; G11C 11/4091; G11C 11/4094; G11C 7/065; G11C 2207/002; G11C 2207/005; G11C 7/1048; G11C 7/12; G11C 8/08
USPC ......................................................... 365/203
See application file for complete search history.

(56) References Cited

U.S. PATENT DOCUMENTS

| | | | |
|---|---|---|---|
| 6,552,944 B2 | 4/2003 | Fifield et al. | |
| 11,024,365 B1 | 6/2021 | Seo | |
| 2005/0030805 A1 | 2/2005 | Lee et al. | |
| 2007/0159901 A1 | 7/2007 | Obara | |
| 2019/0007000 A1* | 1/2019 | Jeong | G11C 11/4096 |
| 2019/0147925 A1* | 5/2019 | Choi | G11C 11/4094 |
| | | | 365/203 |
| 2022/0051713 A1* | 2/2022 | Lu | G11C 11/4094 |
| 2022/0068323 A1* | 3/2022 | Lin | G11C 7/08 |
| 2022/0345099 A1* | 10/2022 | Kim | H03F 1/26 |

FOREIGN PATENT DOCUMENTS

| | | | |
|---|---|---|---|
| CN | 100514490 C | 7/2009 | |
| JP | 3904359 B2 * | 4/2007 | G11C 7/065 |
| TW | 559831 B | 11/2003 | |

OTHER PUBLICATIONS

First Office Action of the Taiwanese application No. 111124654, issued on Nov. 6, 2023, 11 pages with English abstract.

* cited by examiner

*Primary Examiner* — Fernando Hidalgo
(74) *Attorney, Agent, or Firm* — Kilpatrick Townsend & Stockton LLP

(57) ABSTRACT

A control circuit, a method for reading and writing and a memory are provided. The control circuit includes a pre-charge circuit, an amplification circuit and an equalization circuit. The pre-charge circuit is directly electrically connected to at least one of a bit line or a complementary bit line. The amplification circuit has a first node and a second node. The equalization circuit is connected between the first node and the bit line and between the second node and the complementary bit line.

12 Claims, 9 Drawing Sheets

CONTROL CIRCUIT, METHOD FOR READING AND WRITING AND MEMORY

CROSS-REFERENCE TO RELATED APPLICATION

This application claims priority to Chinese patent application No. 202110750195.1 filed on Jul. 2, 2021 and entitled "CONTROL CIRCUIT, METHOD FOR READING AND WRITING AND MEMORY", the disclosure of which is hereby incorporated by reference in its entirety.

TECHNICAL FIELD

The embodiments of the present disclosure relate to the field of semiconductor technology, in particular to a control circuit, a method for reading and writing and a memory.

BACKGROUND

Dynamic Random Access Memory (DRAM) is a semiconductor storage device commonly used in computers, which is composed of many repeated storage sub-circuits. Each storage sub-circuit usually includes a capacitor and a transistor. The gate of the transistor is connected with the word line, the drain of the transistor is connected with the bit line, and the source of the transistor is connected with the capacitor. The voltage signal of the word line can control the transistor to be turned on or turned off, and further the data information stored in the capacitor is read through the bit line, or the data information is written into the capacitor through the bit line for storage.

DRAM can be divided into Double Data Rate (DDR) DRAM, Graphics Double Data Rate (GDDR) DRAM and Low Power Double Data Rate (LPDDR) DRAM. With the increasing number of DRAM application fields, for example, DRAM is increasingly used in the mobile field, users have higher and higher requirements for DRAM power consumption indicators.

SUMMARY

The embodiments of the present disclosure relate to the field of semiconductor technology, in particular to a control circuit, a method for reading and writing and a memory.

The embodiments of the present disclosure provide a control circuit, a method for reading and writing and a memory.

The embodiments of the present disclosure provide a control circuit. The control circuit includes a pre-charge circuit, an amplification circuit and an equalization circuit. The pre-charge circuit is directly electrically connected to at least one of a bit line or a complementary bit line. The pre-charge circuit is configured to pre-charge at least one of the bit line or the complementary bit line in response to a pre-charge signal, so that at least one of a voltage of the bit line or a voltage of the complementary bit line reaches a pre-charge voltage. The amplification circuit has a first node and a second node. The amplification circuit is configured to, in response to control signals, electrically connect the first node with the complementary bit line to amplify a signal of the complementary bit line, and electrically connect the second node with the bit line to amplify a signal of the bit line. The equalization circuit is connected between the first node and the bit line and between the second node and the complementary bit line. The equalization circuit is configured to, in response to an equalization signal, electrically connect the first node with the bit line, and electrically connect the second node with the complementary bit line.

Correspondingly, the embodiments of the present disclosure also provide a reading and writing method for reading and writing using the above-mentioned control circuit. The method includes a pre-charge stage, an offset compensation stage and an amplification stage. In the pre-charge stage, the pre-charge circuit is used to pre-charge at least one of the bit line or the complementary bit line directly in response to the pre-charge signal. In the offset compensation stage, in response to the equalization signal, the equalization circuit is controlled to be turned on, so that the first node is electrically connected with the bit line and the second node is electrically connected with the complementary bit line, to adjust the voltage of the bit line and the voltage of the complementary bit line. In the amplification stage, in response to the control signals, the amplification circuit is used to electrically connect the first node and the complementary bit line to amplify the signal of the complementary bit line, and to electrically connect the second node and the bit line to amplify the signal of the bit line.

Accordingly, the embodiments of the present disclosure also provide a memory. The memory includes a control circuit provided in the above-mentioned embodiments.

BRIEF DESCRIPTION OF THE DRAWINGS

One or more embodiments are exemplified by the pictures in the corresponding drawings, which do not constitute a limitation on the embodiments. Elements with the same reference numerals in the drawings are represented as similar elements. Unless otherwise stated, the figures in the drawings do not constitute a limitation on scale.

DETAILED DESCRIPTION

It can be seen from the background technology that the DRAM performance in the prior art still needs to be improved.

The inventors found that for the existing sense amplifier with offset compensation function, the conduction process of the switching transistor is included in the pre-charge process of the bit line and the complementary bit line, which results in that the charging speed of the bit line and the complementary bit line is not fast enough. With the further miniaturization of the size of the transistor, the saturation current of the switching transistor decreases, the above condition is more serious. It is not conducive to improving the reading and writing performance of memory.

In order to solve the above problem, the embodiments of the present disclosure provide a control circuit. A pre-charge circuit directly charges at least one of the bit line or complementary bit line, which is conducive to shortening the time required for pre-charge.

Compared with the prior art, the technical solutions provided by the embodiments of the present disclosure have the following advantages.

The embodiments of the present disclosure provide a control circuit with superior structure and performance. The control circuit includes the pre-charge circuit, the amplification circuit and the equalization circuit. The pre-charge circuit is directly electrically connected with at least one of the bit line or the complementary bit line. The pre-charge circuit pre-charges at least one of the bit line or the complementary bit line directly, so that at least one of the voltage of the bit line or the voltage of the complementary bit line reaches the pre-charge voltage. In the embodiments of the present disclosure, no other transistor is connected between the amplification circuit and at least one of the bit line or complementary bit line, so that the adverse impact caused by the connected other transistors on the pre-charge speed is avoided. For example, it is not necessary to consider the driving ability of other transistors. The speed for pre-charging can thus be improved, which is conducive to improving the electrical performance of the control circuit.

In order to make the purpose, technical solutions and advantages of the embodiments of the present disclosure more clear, the embodiments of the present disclosure will be described in detail in combination with the accompanying drawings. However, it can be understood by those skilled in the art that in the various embodiments of the present disclosure, many technical details are proposed in order to make the reader better understand the present disclosure. However, even without these technical details and various changes and modifications based on the following embodiments, the technical solutions claimed in the present disclosure can be implemented.

Figure 1:
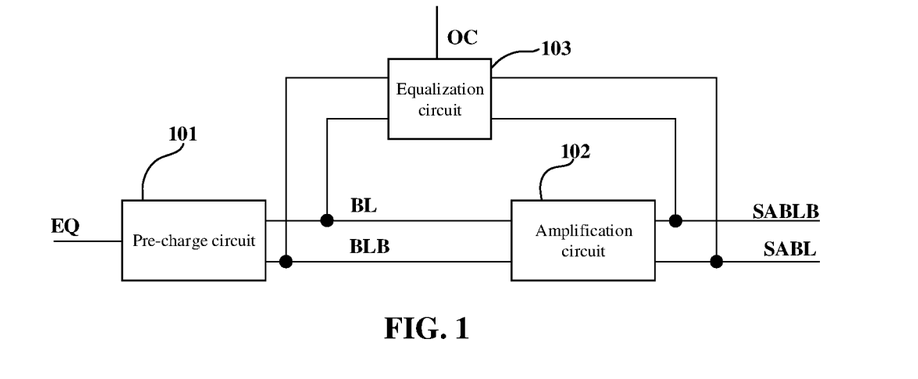
FIG. 1 is a functional block diagram of a control circuit according to the embodiments of the present disclosure.

An embodiment of the present disclosure provides a control circuit. FIG. 1 is a functional block diagram of the control circuit according to the embodiments of the present disclosure.

Referring to FIG. 1, the control circuit includes a pre-charge circuit 101, an amplification circuit 102 and an equalization circuit 103. The pre-charge circuit 101 is directly electrically connected to at least one of a bit line BL or a complementary bit line BLB. The pre-charge circuit is configured to pre-charge at least one of the bit line BL or the complementary bit line BLB in response to a pre-charge signal EQ, so that at least one of a voltage of the bit line BL or a voltage of the complementary bit line BLB reaches a pre-charge voltage. The amplification circuit 102 has a first node SABLB and a second node SABL. The amplification circuit 102 is configured to, in response to control signals, electrically connect the first node SABLB with the complementary bit line BLB to amplify a signal of the complementary bit line BLB, and electrically connect the second node SABL with the bit line BL to amplify a signal of the bit line BL. The equalization circuit 103 is connected between the first node SABLB and the bit line BL and between the second node SABL and the complementary bit line BLB. The equalization circuit 103 is configured to, in response to an equalization signal OC, electrically connect the first node SABLB with the bit line BL, and electrically connect the second node SABL with the complementary bit line BLB.

In present embodiment, since the pre-charge circuit 101 directly pre-charges the bit line BL or the complementary bit line BLB, the bit line BL or the complementary bit line BLB can be pre-charged to the pre-charge voltage faster, so as to improve the pre-charge performance of the control circuit.

The control circuit provided by the present embodiment will be described in more detail below in combination with the accompanying drawings.

Figure 2:
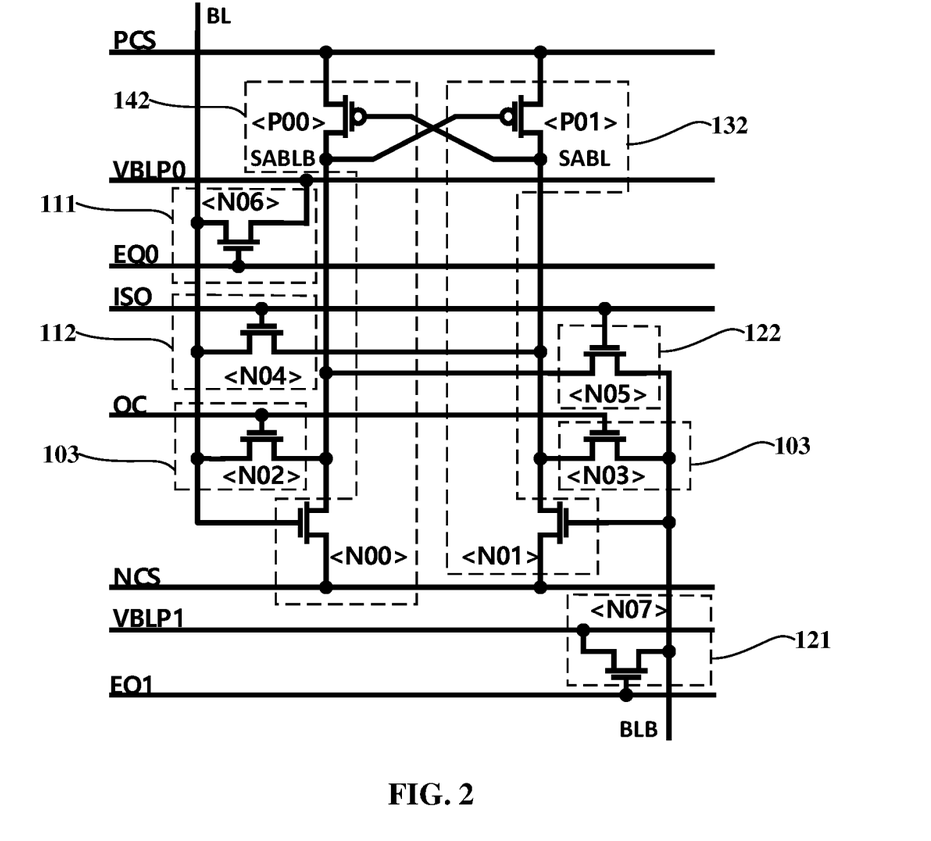
FIG. 2 is a circuit structure diagram of the control circuit according to the embodiments of the present disclosure.

In present embodiment, the pre-charge circuit 101 pre-charges both the bit line BL and the complementary bit line BLB. FIG. 2 is a schematic diagram of a circuit structure of the control circuit according to the present embodiment. Specifically, referring to FIG. 2, the pre-charge signal includes a first pre-charge signal EQ0 and a second pre-charge signal EQ1. The pre-charge circuit 101 includes a first pre-charge sub-circuit 111 and a second pre-charge sub-circuit 121. The first pre-charge sub-circuit 111 is directly electrically connected to the bit line BL and pre-charges the bit line BL in response to the first pre-charge signal EQ0. The second pre-charge sub-circuit 121 is directly electrically connected to the complementary bit line BLB and pre-charges the complementary bit line BLB in response to the second pre-charge signal EQ1.

More specifically, the pre-charge circuit 101 may include at least one first transistor <N06>. The first transistor <N06> has a first gate, a first source and a first drain. The first gate receives the first pre-charge signal EQ0. The first drain is directly connected to the bit line BL. The first transistor <N06> is conducted in response to the first pre-charge signal EQ0. The first source is connected with the pre-charge voltage. Specifically, the pre-charge voltage connected to the first source is defined as a first charging voltage signal VBLP0. Generally, A level of the first charging voltage signal VBLP0 is VCC/2. After the first transistor <N06> is conducted, which is equivalent to that the bit line BL receives the first charging voltage signal VBLP0, the pre-charge of the bit line BL is implemented.

The pre-charge circuit 101 may further include at least one second transistor <N07>. The second transistor <N07> has a second gate, a second source and a second drain. The second gate receives the second pre-charge signal EQ1. The second drain is directly connected to the complementary bit line. The second transistor <N07> is conducted in response to the second pre-charge signal EQ1. The second source is connected with the pre-charge voltage. Specifically, the pre-charge voltage connected to the second source is defined as a second charging voltage signal VBLP1. Generally, a level of the second charging voltage signal VBLP1 is VCC/2. After the second transistor <N07> is conducted, which is equivalent to that the complementary bit line BLB receives the second charging voltage signal VBLP1, the pre-charge of the complementary bit line BLB is implemented.

Figure 3:
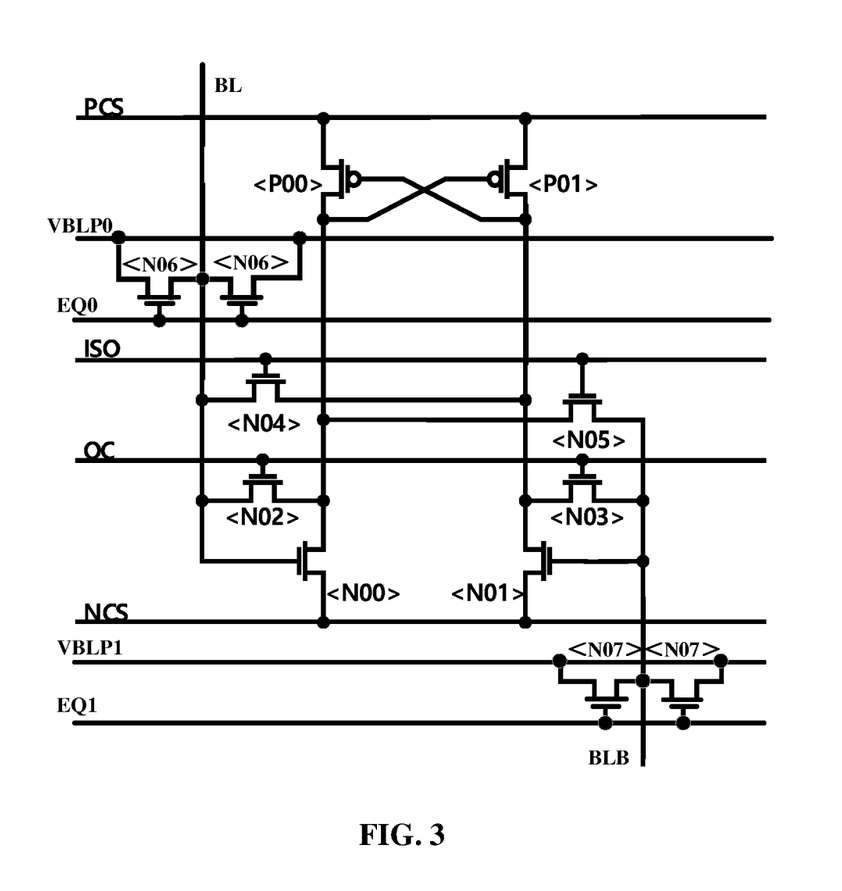
FIG. 3 is another circuit structure diagram of the control circuit according to the embodiments of the present disclosure.

In some embodiments, as shown in FIG. 2, the number of the first transistor <N06> and the number of the second transistor <N07> are both one. FIG. 3 is another circuit structure diagram of the control circuit. In other embodiments, as shown in FIG. 3, the number of the first transistors <N06> may be 2, the number of the second transistors <N07> may also be 2. The two first transistors <N06> are connected in series and are connected to the bit line BL. The two second transistors <N07> are connected in series and are connected to the complementary bit line BLB. Compared with the solution of one first transistor and one second transistor, when the number of the first transistors <N06> is 2, the conduction current when the first transistors <N06> are conducted can be increased without increasing the trench width-to-length ratio of the first transistors <N06>. Similarly, when the number of the second transistors <N07> is 2, the conduction current when the second transistors <N07> are conducted can be increased without increasing the trench width-to-length ratio of the second transistors <N07>. Therefore, the conduction current can be increased and the requirements of layout design can also be met. It should be understood that in other embodiments, the number of first transistors may also be greater than 2, and the number of second transistors may also be greater than 2. Specifically, the first transistor <N06> may be an NMOS transistor, and the second transistor <N07> may be an NMOS transistor.

Figure 4:
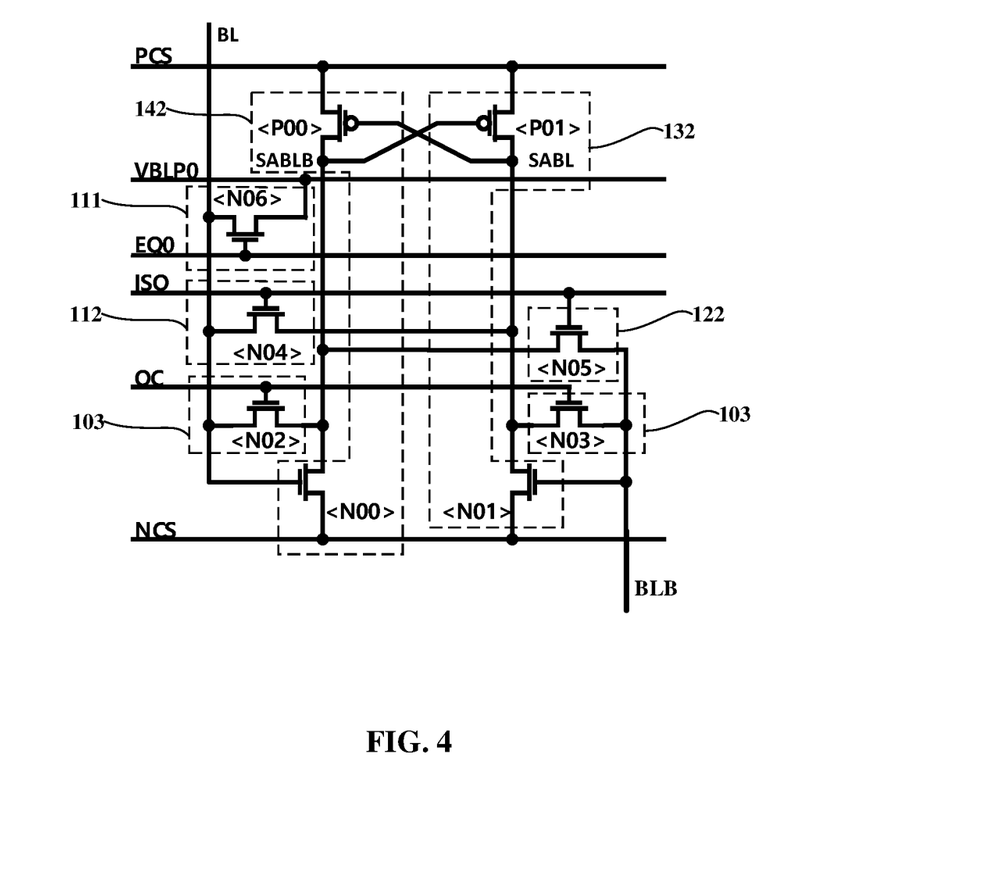
FIG. 4 is another circuit structure diagram of the control circuit according to the embodiments of the present disclosure.

FIG. 4 is another circuit structure diagram of the control circuit of present embodiment. Referring to FIG. 4, in some embodiments, the pre-charge circuit 101 may pre-charge the bit line BL merely. Accordingly, the pre-charge signal EQ includes the first pre-charge signal EQ0. The pre-charge circuit 101 includes a first pre-charge sub-circuit 111, which is directly electrically connected to the bit line BL. The first pre-charge sub-circuit 111 pre-charges the bit line BL in response to the first pre-charge signal EQ0.

Figure 5:
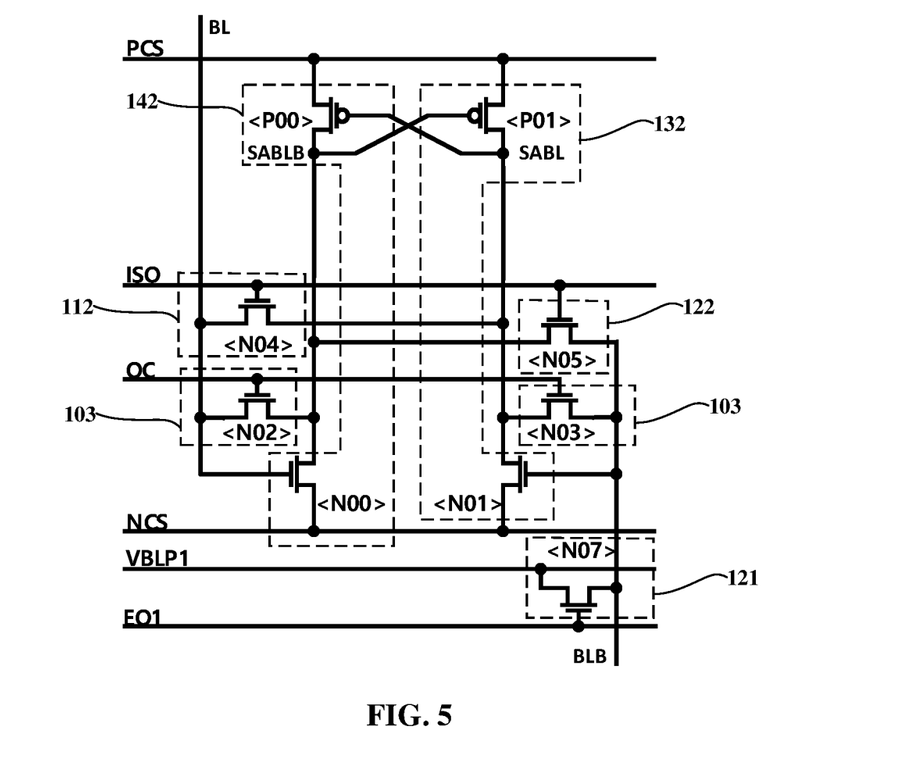
FIG. 5 is another circuit structure diagram of the control circuit according to the embodiment of the present disclosure.

FIG. 5 is another circuit structure diagram of the control circuit of present embodiment. Referring to FIG. 5, in other embodiments, the pre-charge circuit 101 may pre-charge only the complementary bit line BLB. Accordingly, the pre-charge signal EQ includes a second pre-charge signal EQ1. The pre-charge circuit 101 includes a second pre-charge sub-circuit 121, which is directly electrically connected to the complementary bit line BLB. The second pre-charge sub-circuit 121 pre-charges the complementary bit line BLB in response to the second pre-charge signal EQ1.

In present embodiment, the control signals include a connection control signal ISO and a level control signal. The amplification circuit 102 includes a first switch circuit 112, a second switch circuit 122, a first inverter 132 and a second inverter 142. The first switch circuit 112 is connected between the bit line BL and the second node SABL. The first switch circuit 112 is configured to be turned on in response to the connection control signal ISO to connect the bit line BL with the second node SABL. The second switch circuit 122 is connected between the complementary bit line BLB and the first node SABLB. The second switch circuit 122 is configured to be turned on in response to the connection control signal ISO to connect the complementary bit line BLB with the first node SABLB. The first node SABLB is a first input end of the first inverter 132, a first output end of the first inverter 132 is connected to the bit line BL through the first switch circuit 112, the first output end of the first inverter 132 is electrically connected to the second node SABL, and the first inverter 132 is turned on based on the level control signal. The second node SABL is a second input end of the second inverter 142, a second output end of the second inverter 142 is connected to the complementary bit line BLB through the second switch circuit 122, the second output end of the second inverter 142 is electrically connected to the first node SABLB, and the second inverter 142 is turned on based on the level control signal.

Specifically, the operation period of the control circuit may include a offset compensation stage, which may also be referred to as an equalization stage. In the offset compensation stage, the equalization circuit 103 electrically connects the first node SABLB with the bit line BL in response to the equalization signal OC, and the equalization circuit 103 further electrically connects the second node SABL with the complementary bit line BLB in response to the equalization signal OC. In the offset compensation phase, the first switch circuit 112 and the second switch circuit 122 are turned off, the first inverter 132 is turned on based on the level control signal, the second inverter 142 is turned on based on the level control signal, and the first inverter 132 and the second inverter 142 work, so as to adjust the voltage of the bit line BL and the voltage of the complementary bit line BLB, such that the offset between the transistor of the first inverter 132 and the transistor of the second inverter 142 is compensated.

The first switch circuit 112 may include a third transistor <N04>. The third transistor <N04> has a third gate and is connected between the bit line BL and the second node SABL. The third gate receives the connection control signal ISO, so that the third transistor <N04> is conducted. Specifically, the third transistor <N04> may be an NMOS transistor.

The second switch circuit 122 may include a fourth transistor <N05>. The fourth transistor <N05> has a fourth gate and is connected between the complementary bit line BLB and the first node SABLB. The fourth gate receives the connection control signal ISO, so that the fourth transistor <N05> is conducted. Specifically, the fourth transistor <N05> may be an NMOS transistor.

It should be understood that in other embodiments, the third transistor may also be a PMOS transistor, and the fourth transistor may also be a PMOS transistor.

In this embodiment, the level control signal includes a first level signal NCS and the second level signal PCS. A level of the first level signal NCS is less than a level of the second level signal PCS. That is, the first level signal NCS is a low level signal and the second level signal PCS is a high level signal.

It should be noted that the "high level" and "low level" mentioned in the embodiments of the disclosure are relative concepts, which means that, for example, the voltage value of a high level signal is higher than the voltage value of a low level signal. The specific voltage value of the high level signal and the specific voltage value of the low level signal are not limited. Further, it is not limited that the voltage values of all high level signals or the voltage values of all low level signals mentioned in the embodiments of the disclosure are equal. For example, the voltage value of the high level voltage applied on the word line may be different from the value of the high level voltage applied on the bit line. Further, it is also not limited that the voltage values of the high level voltage of a specific signal in different stages are equal. For example, the voltage value of the high level voltage applied on the bit line in writing stage may be different from that in reading stage. The skilled person in the art can understand that the voltage values corresponding to "high level" and "low level" can be self-determined according to at least one of the following: the requirements of the process nodes, the requirements of speed, the requirements of reliability, and so on.

Accordingly, the first inverter 132 may include the first PMOS <P01> and the first NMOS <N01>. A gate of the first PMOS <P01> is connected to the first node SABLB. A gate of the first NMOS <N01> is connected to the first node SABLB through the second switch circuit 122. A drain of the first PMOS <P01> is connected to a drain of the first NMOS <N01> and serves as the first output end. A source of the first PMOS <P01> receives the second level signal PCS. The source of the first NMOS <N01> receives the first level signal NCS.

The second inverter 142 includes a second PMOS <P00> and a second NMOS <N00>. A gate of the second PMOS is connected to the second node SABL. A gate of the second NMOS <N00> is connected to the second node SABL through the first switch circuit 112. A drain of the second PMOS <P00> is connected to the drain of the second NMOS <N00> and serves as the second output end. A source of the second PMOS <P00> receives the second level signal PCS. The source of the second NMOS <N00> receives the first level signal NCS.

Specifically, in some embodiments, the first level signal NCS and the second level signal PCS may include a first stage and a second stage that are performed in sequence. In the first stage, an absolute value of the level of the first level signal NCS increases gradually, and an absolute value of the level of the second level signal PCS increases gradually. In the second stage, the level of the first level signal NCS remains unchanged, and the level of the second level signal PCS remains unchanged. The first level signal NCS and the second level signal PCS may also include a third stage after the second stage. In the third stage, the absolute value of the level of the first level signal NCS and the absolute value of the level of the second level signal PCs decrease gradually.

It should be understood that in other embodiments, the level of the first level signal NCS and the level of the second level signal PCS may also remain unchanged.

In the present embodiment, the equalization circuit 103 may include the fifth transistor <N02>. The fifth transistor <N02> has a fifth gate and is connected between the bit line BL and the first node SABLB. The fifth gate receives the equalization signal OC, so that the fifth transistor <N02> is conducted. The equalization circuit includes a sixth transistor <N03>. The sixth transistor <N03> has a sixth gate and is connected between the complementary bit line BLB and the second node SABL. The sixth gate receives the equalization signal OC, so that the sixth transistor <N03> is conducted.

Specifically, the fifth transistor <N02> may be an NMOS, and the sixth transistor <N03> may be an NMOS. It should be understood that in other embodiments, the fifth transistor may also be a PMOS, and the sixth transistor may also be a PMOS.

Figure 6:
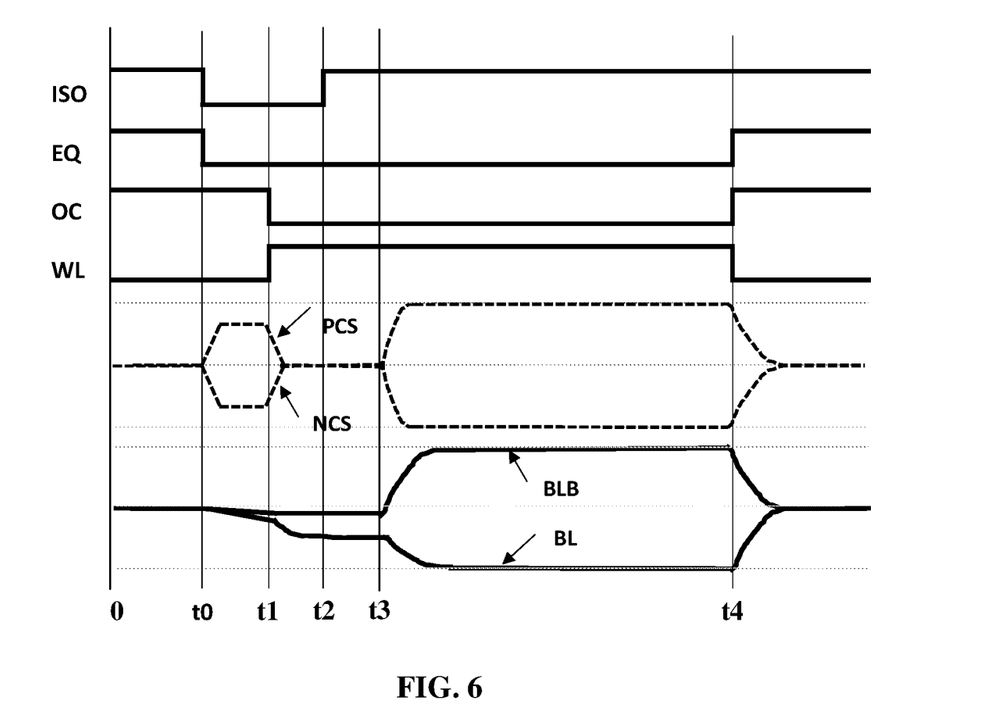
FIG. 6 is a timing diagram of a control circuit according to the embodiments of the present disclosure.

FIG. 6 is a timing diagram of the control circuit according to the embodiments. FIG. 6 can correspond to the circuit diagram provided by FIG. 2. The working principle of the control circuit will be described below in combination with FIG. 2 and FIG. 6.

The operation period of the control circuit may include a pre-charge stage, an offset compensation stage, a first charge sharing stage, a second charge sharing stage and an amplification stage which are performed in sequence. Take the control circuit performing reading operation and reading "0" as an example.

The 0~t0 stage is the pre-charge stage. The pre-charge circuit 101 pre-charges the bit line BL and the complementary bit line BLB in response to the pre-charge signal EQ, so that the voltage of the bit line BL and the voltage of the complementary bit line BLB reach the pre-charge voltage respectively. Specifically, the first pre-charge signal EQ0 and the second pre-charge signal EQ1 may be synchronous signals with the same level. The first transistor <N06> receives the first pre-charge signal EQ0 so as to be conducted, and the second transistor <N07> receives the second pre-charge signal EQ1 so as to be conducted. In this stage, the level of the bit line BL and the complementary bit line BLB is finally VCC/2. In addition, the first switch circuit 112, i.e., the third transistor <N04> may also be conducted in response to the connection control signal ISO. The second switch circuit 122, i.e., the fourth transistor <N05> may also be conducted in response to the connection control signal ISO. The fifth transistor <N02> may also be conducted in response to the equalization signal OC, and the sixth transistor <N03> may also be conducted in response to the equalization signal OC. It should be understood that in the pre-charge stage, the connection control signal and equalization signal may be chosen to be not provided.

The t0~t1 stage is the offset compensation stage. In response to the equalization signal OC, the equalization circuit 103 is turned on, so that the first node SABL and the complementary bit line BLB are electrically connected, and the second node SABLB and the bit line BL are electrically connected, thereby adjusting the voltages of the bit line BL and the complementary bit line BLB. Specifically, both the fifth transistor <N02> and the sixth transistor <N03> are conducted in response to the equalization signal OC. In addition, both the first inverter 132 and the second inverter 142 are turned on after receiving the level control signal, that is, the first level control signal NCS and the second level control signal PCS are provided. At this stage, the level of the complementary bit line BLB and the level of the bit line BL decrease slightly, and the level of the bit line BL decreases more than that of the complementary bit line BLB.

The t1~t2 stage is the first charge sharing stage, in which the word line is selected and the equalization circuit 103 is closed. At this stage, the level of the complementary bit line BLB remains basically unchanged, and the level of the bit line BL continues to decline until it remains basically unchanged.

The t2~t3 stage is the second charge sharing stage. The word line is continued to be selected and provides the connection control signal ISO, so that the first switch circuit 112 and the second switch circuit 122 are turned on. The bit line BL is electrically connected to the second node SABL, and the complementary bit line BLB is electrically connected to the first node SABLB. At this stage, the level of the bit line BL and the level of the complementary bit line BLB remain basically unchanged.

The t3~t4 is the amplification stage. In response to the connection control signal ISO and the level control signal (the first level control signal NCS and the second level control signal PCS), the amplification circuit 102 electrically connects the first node SABLB with the complementary bit line BLB to amplify the signal of the complementary bit line BLB, and electrically connects the second node SABL with the bit line BL to amplify the signal of the bit line BL. At this stage, the first input of the first inverter 132 is electrically connected to the second output of the second inverter 142, and the first output of the first inverter 132 is electrically connected to the second input of the second inverter 142. The level of bit line BL decreases to the lowest value gradually, and the level of complementary bit line BLB increases to the highest value gradually.

Figure 7:
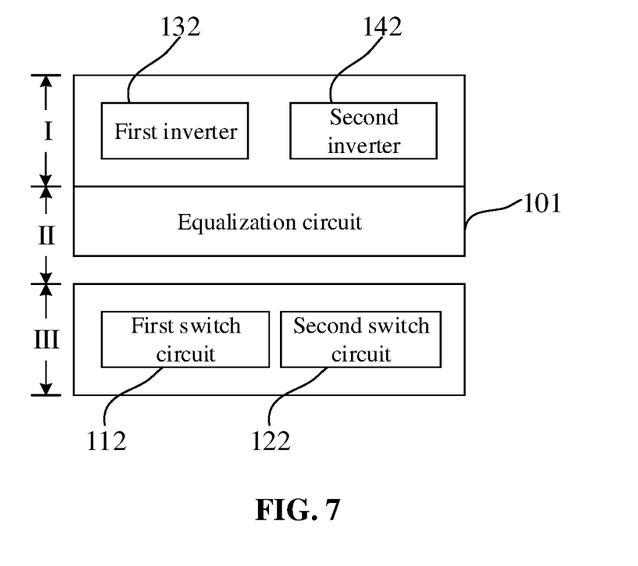
FIG. 7 is a layout diagram of a control circuit according to the embodiments of the present disclosure.

Since the pre-charge circuit 101 directly charges the bit line BL and the complementary bit line BLB, the time required for pre-charge is obviously shortened, which is conducive to improving the reading and writing speed of the control circuit. FIG. 7 is a layout diagram of the control circuit according to the embodiments. As shown in FIG. 7, in some embodiments, the first inverter 132 and the second inverter 142 may be arranged in the first area I, the pre-charge circuit 101 may be arranged in the second area II, and the first switch circuit 112, the second switch circuit 122 and the equalization circuit 103 may be arranged in the third area III. The second region II is located between the first region I and the third region III. Since the pre-charge circuit 101 is arranged in the middle position, which is conducive to the balance of the distance between the pre-charge circuit 101 and the bit line BL and the distance between the pre-charge circuit 101 and the complementary bit line BLB, so that both the bit line BL and the complementary bit line BLB can reach the pre-charge voltage as soon as possible.

In the control circuit provided by the embodiments, since the pre-charge circuit 101 charges at least one of the bit line BL or the complementary bit line BLB directly, it is conducive to shortening the time required for pre-charge, so as to improve the electrical performance of the control circuit.

The embodiments of the present disclosure also provide a memory, which includes the control circuit in the above embodiments.

Figure 8:
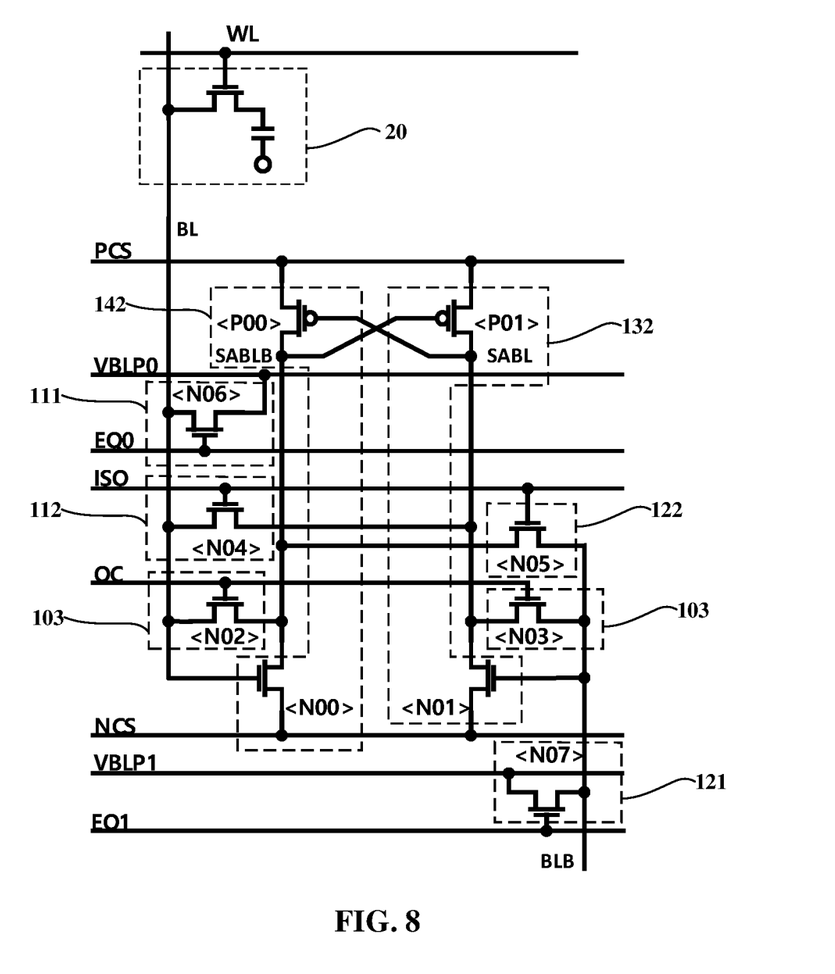
FIG. 8 is a schematic diagram of a circuit structure of a memory according to the embodiments of the present disclosure.

FIG. 8 is a schematic diagram of a circuit structure of the memory provided by the embodiments of the present disclosure. Referring to FIG. 8, the memory includes a storage sub-circuit 20, which is connected to a word line WL and a bit line BL. the storage sub-circuit 20 may include a switching transistor (not shown) and a storage capacitor (not shown). The specific description of the control circuit may be referred to the detailed description of the above embodiments, which will not be repeated in the following.

The memory may be DRAM memory, such as DDR3 DRAM, DDR4 DRAM or DDR5 DRAM. In other embodiments, the memory may also be SRAM, MRAM, FeRAM, PCRAM, NAND, NOR, etc. In the embodiments, since the speed for pre-charging at least one of the bit line or complementary bit line is improved, the reading and writing performance of the memory is better.

The embodiments of the present disclosure also provide a reading and writing method for reading and writing using the control circuit according to the above embodiments. The reading and writing method provided by the embodiments of the present disclosure will be described in detail below in combination with the accompanying drawings.

Figure 9:
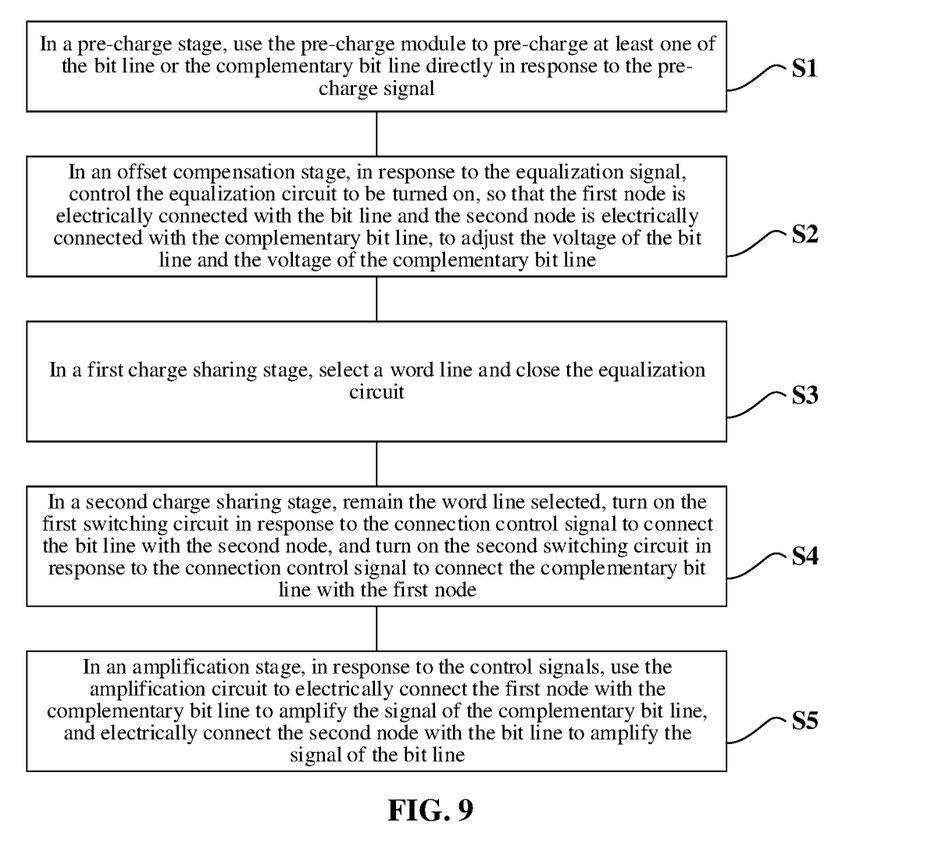
FIG. 9 is a flow diagram of the reading and writing method according to the embodiments of the present disclosure.

FIG. 9 is a flow diagram of the reading and writing method according to the embodiments of the present disclosure.

Referring to FIG. 9, the reading and writing method includes the following steps.

In step S1, in a pre-charge stage, the pre-charge circuit is used to pre-charge at least one of the bit line or the complementary bit line directly in response to the pre-charge signal.

Specifically, the pre-charge circuit may pre-charge the bit line and the complementary bit line, or pre-charge only one of the bit line and the complementary bit line. Since the pre-charge circuit pre-charges at least one of the bit line or complementary bit line directly without considering the driving abilities of other transistors, it is conducive to improving the speed for pre-charging, so that at least one of the bit line or complementary bit line can reach the pre-charge voltage faster.

In step S2, in an offset compensation stage, in response to the equalization signal, the equalization circuit is controlled to be turned on, so that the first node is electrically connected with the bit line and the second node is electrically connected with the complementary bit line, to adjust the voltage of the bit line and the voltage of the complementary bit line.

Specifically, the control signals include a connection control signal and a level control signal. The amplification circuit includes a first switch circuit, a second switch circuit, a first inverter and a second inverter. The first switch circuit is connected between the bit line and the second node. The first switch circuit is configured to be turned on in response to the connection control signal to connect the bit line with the second node. The second switch circuit is connected between the complementary bit line and the first node. The second switch circuit is configured to be turned on in response to the connection control signal to connect the complementary bit line with the first node. The first node is a first input end of the first inverter. A first output end of the first inverter is connected to the bit line through the first switch circuit. The first output end is electrically connected to the second node. The second node is a second input end of the second inverter. A second output end of the second inverter is connected to the complementary bit line through the second switch circuit. The second output end is electrically connected to the first node.

The offset compensation stage specifically includes: controlling the equalization circuit to be turned on in response to the equalization signal, and controlling the first inverter and the second inverter to be turned on in response to the level control signal, to compensate an offset between the first inverter and the second inverter.

The subsequent steps include the amplification stage. In some embodiments, the following steps may be carried out in sequence after the offset compensation stage and before the amplification stage.

In step S3, in the first charge sharing stage, the word line is selected and the equalization circuit is closed.

At this stage, taking the reading operation as an example, in some embodiments, if "0" is stored in the storage sub-circuit connected to the bit line and corresponding to the selected word line, the level of the bit line decreases while the level of the complementary bit line remains basically unchanged. In other embodiments, if "1" is stored in the storage sub-circuit connected to the bit line and corresponding to the selected word line, the level of the bit line rises while the level of the complementary bit line remains basically unchanged.

In step S4, in a second charge sharing stage, the word line remains selected, the first switch circuit is turned on in response to the connection control signal to connect the bit line with the second node, and the second switch circuit is turned on in response to the connection control signal to connect the complementary bit line with the first node.

At this stage, the connection control signal is provided. If the connection control signal is high level, the bit line is electrically connected to the second node, the complementary bit line is connected to the second node, and both the first inverter and the second inverter are turned on.

In some embodiments, "0" is stored in the storage sub-circuit connected to the bit line and corresponding to the selected word line. Based on the voltage difference between the bit line and the complementary bit line, the voltage of the second node is reduced to the same voltage as the bit line, and the voltage of the first node is increased to the same voltage as the complementary bit line. In other embodiments, "1" is stored in the storage sub-circuit connected to the bit line and corresponding to the selected word line. Based on the voltage difference between the bit line and the complementary bit line, the voltage of the second node increases to the same voltage as the bit line, and the voltage of the first node decreases to the same voltage as the complementary bit line.

In step S5, in the amplification stage, in response to the control signals, the amplification circuit is used to electrically connect the first node with the complementary bit line to amplify the signal of the complementary bit line, and electrically connect the second node and the bit line to amplify the signal of the bit line.

Specifically, in the amplification stage, the level control signal includes a first stage and a second stage that are performed in sequence. An absolute value of a level of the level control signal increases gradually in the first stage. The level of the level control signal remains unchanged in the second stage. More specifically, the level control signal includes a first level control signal and a second level control signal, and the first level control signal and the second level control signal are mutually inverted signals.

In some embodiments, if "0" is stored in the storage sub-circuit connected to the bit line and corresponding to the selected word line, the amplification circuit is turned on, so that the voltage of the bit line gradually decreases to the stable value and the voltage of the complementary bit line gradually increases to the stable value. In other embodiments, if "1" is stored in the storage sub-circuit connected to the bit line and corresponding to the selected word line, the amplification circuit is turned on, so that the voltage of the bit line gradually increases to a stable value and the voltage of the complementary bit line gradually decreases to a stable value.

Because the pre-charge circuit charges at least one of the bit line or complementary bit line directly, the reading and writing method provided in the embodiments is conducive to shortening the time required for pre-charge, thereby improving the electrical performance of the control circuit.

Those skilled in the art should understand that the above embodiments are specific embodiments to implement the present disclosure, and in practical application, various changes may be made in form and details without departing from the spirit and scope of the present disclosure. Any person skilled in the art may make changes and modifications without departing from the spirit and scope of the present disclosure. Therefore, the protection scope of the present disclosure shall be subject to the scope defined in the claims.

The invention claimed is:

1. A control circuit, comprising:
a pre-charge circuit directly electrically connected to at least one of a bit line or a complementary bit line, configured to pre-charge at least one of the bit line or the complementary bit line in response to a pre-charge signal, so that at least one of a voltage of the bit line or a voltage of the complementary bit line reaches a pre-charge voltage;
an amplification circuit having a first node and a second node, configured to, in response to control signals, electrically connect the first node with the complementary bit line to amplify a signal of the complementary bit line, and electrically connect the second node with the bit line to amplify a signal of the bit line; and
an equalization circuit connected between the first node and the bit line and between the second node and the complementary bit line, configured to, in response to an equalization signal, electrically connect the first node with the bit line, and electrically connect the second node with the complementary bit line; and,
wherein the control signals comprise a connection control signal and a level control signal, and the amplification circuit comprises:
a first switch circuit connected between the bit line and the second node, configured to be turned on in response to the connection control signal to connect the bit line with the second node;
a second switch circuit connected between the complementary bit line and the first node, configured to be turned on in response to the connection control signal to connect the complementary bit line with the first node;
a first inverter, wherein the first node is a first input end of the first inverter, a first output end of the first inverter is connected to the bit line through the first switch circuit, the first output end is electrically connected to the second node, and the first inverter is turned on based on the level control signal;
a second inverter, wherein the second node is a second input end of the second inverter, a second output end of the second inverter is connected to the complementary bit line through the second switch circuit, the second output end is electrically connected to the first node, and the second inverter is turned on based on the level control signal;
the pre-charge signal comprises a first pre-charge signal, the pre-charge circuit comprises at least one first transistor, each of the at least one first transistor has a first gate, a first source and a first drain, the first gate receives the first pre-charge signal, the first drain is directly connected to the bit line, the first source is connected with the pre-charge voltage, and the at least one first transistor is conducted in response to the first pre-charge signal; and
wherein the pre-charge signal comprises a second pre-charge signal, the pre-charge circuit comprises at least one second transistor, each of the at least one second transistor has a second gate, a second source and a second drain, the second gate receives the second pre-charge signal, the second drain is directly connected to the complementary bit line, the second source is connected with the pre-charge voltage, and the at least one second transistor is conducted in response to the second pre-charge signal.

2. The control circuit of claim 1, wherein a number of the at least one first transistor is 2.

3. The control circuit of claim 1, wherein a number of the at least one second transistor is 2.

4. The control circuit of claim 1, wherein the first switch circuit comprises a third transistor, the third transistor has a third gate and is connected between the bit line and the second node, and the third gate receives the connection control signal, so that the third transistor is conducted; and
wherein the second switch circuit comprises a fourth transistor, the fourth transistor has a fourth gate and is connected between the complementary bit line and the first node, and the fourth gate receives the connection control signal, so that the fourth transistor is conducted.

5. The control circuit of claim 1, wherein the level control signal comprises a first level signal and a second level signal, a level of the first level signal is less than a level of the second level signal; the first inverter comprises a first PMOS and a first NMOS, a gate of the first PMOS is connected to the first node, a gate of the first NMOS is connected to the first node through the second switch circuit, a drain of the first PMOS is connected to a drain of the first NMOS and serves as the first output end, a source of the first PMOS receives the second level signal, and the source of the first NMOS receives the first level signal;
wherein the second inverter comprises a second PMOS and a second NMOS, a gate of the second PMOS is connected to the second node, a gate of the second NMOS is connected to the second node through the first switch circuit, a drain of the second PMOS is connected to a drain of the second NMOS and serves as the second output end, a source of the second PMOS receives the second level signal, and the source of the second NMOS receives the first level signal.

6. The control circuit of claim 1, wherein the equalization circuit comprises:
   a fifth transistor, wherein the fifth transistor has a fifth gate and is connected between the bit line and the first node, and the fifth gate receives the equalization signal, so that the fifth transistor is conducted; and
   a sixth transistor, wherein the sixth transistor has a sixth gate and is connected between the complementary bit line and the second node, and the sixth gate receives the equalization signal, so that the sixth transistor is conducted.

7. The control circuit of claim 1, wherein the first inverter and the second inverter are arranged in a first area, the pre-charge circuit is arranged in a second area, the first switch circuit, the second switch circuit and the equalization circuit are arranged in a third area, and the second area is located between the first area and the third area.

8. A reading and writing method for reading and writing using a control circuit comprising:
   a pre-charge circuit directly electrically connected to at least one of a bit line or a complementary bit line, configured to pre-charge at least one of the bit line or the complementary bit line in response to a pre-charge signal, so that at least one of a voltage of the bit line or a voltage of the complementary bit line reaches a pre-charge voltage;
   an amplification circuit having a first node and a second node, configured to, in response to control signals, electrically connect the first node with the complementary bit line to amplify a signal of the complementary bit line, and electrically connect the second node with the bit line to amplify a signal of the bit line; and
   an equalization circuit connected between the first node and the bit line and between the second node and the complementary bit line, configured to, in response to an equalization signal, electrically connect the first node with the bit line, and electrically connect the second node with the complementary bit line; and,
   wherein the control signals comprises a connection control signal and a level control signal, and the amplification circuit comprises:
   a first switch circuit connected between the bit line and the second node, configured to be turned on in response to the connection control signal to connect the bit line with the second node;
   a second switch circuit connected between the complementary bit line and the first node, configured to be turned on in response to the connection control signal to connect the complementary bit line with the first node;
   a first inverter, wherein the first node is a first input end of the first inverter, a first output end of the first inverter is connected to the bit line through the first switch circuit, the first output end is electrically connected to the second node; and
   a second inverter, wherein the second node is a second input end of the second inverter, a second output end of the second inverter is connected to the complementary bit line through the second switch circuit, the second output end is electrically connected to the first node;
   the reading and writing method comprises:
   in a pre-charge stage, using the pre-charge circuit to pre-charge at least one of the bit line or the complementary bit line directly in response to the pre-charge signal;
   in an offset compensation stage, in response to the equalization signal, controlling the equalization circuit to be turned on, so that the first node is electrically connected with the bit line and the second node is electrically connected with the complementary bit line, to adjust the voltage of the bit line and the voltage of the complementary bit line;
   in an amplification stage, in response to the control signals, using the amplification circuit to electrically connect the first node and the complementary bit line to amplify the signal of the complementary bit line, and to electrically connect the second node and the bit line to amplify the signal of the bit line; and
   the offset compensation stage specifically comprises: controlling the equalization circuit to be turned on in response to the equalization signal, and controlling the first inverter and the second inverter to be turned on in response to the level control signal, to compensate an offset between the first inverter and the second inverter; and
   in the amplification stage, the level control signal comprises a first stage and a second stage that are performed in sequence, an absolute value of a level of the level control signal increases gradually in the first stage, and the level of the level control signal remains unchanged in the second stage.

9. The reading and writing method of claim 8, after the offset compensation stage and before the amplification stage, further comprising the following stages in sequence:
   a first charge sharing stage, wherein a word line is selected and the equalization circuit is closed;
   a second charge sharing stage, wherein the word line remains selected, the first switch circuit is turned on in response to the connection control signal to connect the bit line with the second node, and the second switch circuit is turned on in response to the connection control signal to connect the complementary bit line with the first node.

10. A memory, comprising a control circuit comprising:
   a pre-charge circuit directly electrically connected to at least one of a bit line or a complementary bit line, configured to pre-charge at least one of the bit line or the complementary bit line in response to a pre-charge signal, so that at least one of a voltage of the bit line or a voltage of the complementary bit line reaches a pre-charge voltage;
   an amplification circuit having a first node and a second node, configured to, in response to control signals, electrically connect the first node with the complementary bit line to amplify a signal of the complementary bit line, and electrically connect the second node with the bit line to amplify a signal of the bit line; and
   an equalization circuit connected between the first node and the bit line and between the second node and the complementary bit line, configured to, in response to an equalization signal, electrically connect the first node with the bit line, and electrically connect the second node with the complementary bit line; and,
   wherein the control signals comprise a connection control signal and a level control signal, and the amplification circuit comprises:

a first switch circuit connected between the bit line and the second node, configured to be turned on in response to the connection control signal to connect the bit line with the second node;

a second switch circuit connected between the complementary bit line and the first node, configured to be turned on in response to the connection control signal to connect the complementary bit line with the first node;

a first inverter, wherein the first node is a first input end of the first inverter, a first output end of the first inverter is connected to the bit line through the first switch circuit, the first output end is electrically connected to the second node, and the first inverter is turned on based on the level control signal; and a second inverter, wherein the second node is a second input end of the second inverter, a second output end of the second inverter is connected to the complementary bit line through the second switch circuit, the second output end is electrically connected to the first node, and the second inverter is turned on based on the level control signal;

the pre-charge signal comprises a first pre-charge signal, the pre-charge circuit comprises at least one first transistor, each of the at least one first transistor has a first gate, a first source and a first drain, the first gate receives the first pre-charge signal, the first drain is directly connected to the bit line, the first source is connected with the pre-charge voltage, and the at least one first transistor is conducted in response to the first pre-charge signal; and the pre-charge signal comprises a second pre-charge signal, the pre-charge circuit comprises at least one second transistor, each of the at least one second transistor has a second gate, a second source and a second drain, the second gate receives the second pre-charge signal, the second drain is directly connected to the complementary bit line, the second source is connected with the pre-charge voltage, and the at least one second transistor is conducted in response to the second pre-charge signal.

11. The memory of claim 10, wherein a number of the at least one first transistor is 2.

12. The memory of claim 10, wherein a number of the at least one second transistor is 2.

* * * * *